(12) United States Patent
Yang et al.

(10) Patent No.: US 10,512,147 B1
(45) Date of Patent: Dec. 17, 2019

(54) EXTREME ULTRAVIOLET RADIATION SOURCE AND DROPLET CATCHER THEREOF

(71) Applicant: Taiwan Semiconductor Manufacturing Co., Ltd., Hsinchu (TW)

(72) Inventors: Chi Yang, Taichung (TW); Sheng-Ta Lin, Gongguan Township, Miaoli County (TW); Ssu-Yu Chen, New Taipei (TW); Shang-Chieh Chien, New Taipei (TW); Li-Jui Chen, Hsinchu (TW); Po-Chung Cheng, Zhongpu Shiang (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/240,951

(22) Filed: Jan. 7, 2019

Related U.S. Application Data

(60) Provisional application No. 62/703,953, filed on Jul. 27, 2018.

(51) Int. Cl.
*H05G 2/00* (2006.01)
*G03F 7/20* (2006.01)
*G03F 1/24* (2012.01)

(52) U.S. Cl.
CPC ............ *H05G 2/005* (2013.01); *G03F 1/24* (2013.01); *G03F 7/70033* (2013.01); *H05G 2/008* (2013.01); *G03F 7/702* (2013.01)

(58) Field of Classification Search
CPC .............................. H05G 2/005; H05G 2/008
See application file for complete search history.

(56) References Cited

U.S. PATENT DOCUMENTS

| | | |
|---|---|---|
| 8,764,995 B2 | 7/2014 | Chang et al. |
| 8,796,666 B1 | 8/2014 | Huang et al. |
| 8,828,625 B2 | 9/2014 | Lu et al. |
| 8,841,047 B2 | 9/2014 | Yu et al. |
| 8,877,409 B2 | 11/2014 | Hsu et al. |
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |

(Continued)

*Primary Examiner* — Eliza W Osenbaugh-Stewart
(74) *Attorney, Agent, or Firm* — McClure, Qualey & Rodack, LLP

(57) ABSTRACT

An extreme ultraviolet radiation source is provided, including a droplet generator and a droplet catcher. The droplet generator is configured to output a plurality of target droplets along a target droplet path that is parallel to a horizontal direction. The droplet catcher includes an open end substantially aligned with the target droplet path, and an enclosed end that is opposite to the open end. The droplet catcher also includes a pipe wall disposed between the open end the enclosed end. The pipe wall includes a first pipe wall portion having an inner top surface parallel to the horizontal direction and an inner bottom surface inclined relative to the inner top surface. In addition, the droplet catcher includes at least one gutter formed on the inner bottom surface and having a long axis extending along the horizontal direction.

20 Claims, 9 Drawing Sheets

(56) References Cited

U.S. PATENT DOCUMENTS

2010/0213395 A1* 8/2010 Ueno .................... H05G 2/003
 250/504 R
2010/0258748 A1* 10/2010 Vaschenko ............. H05G 2/003
 250/504 R

* cited by examiner

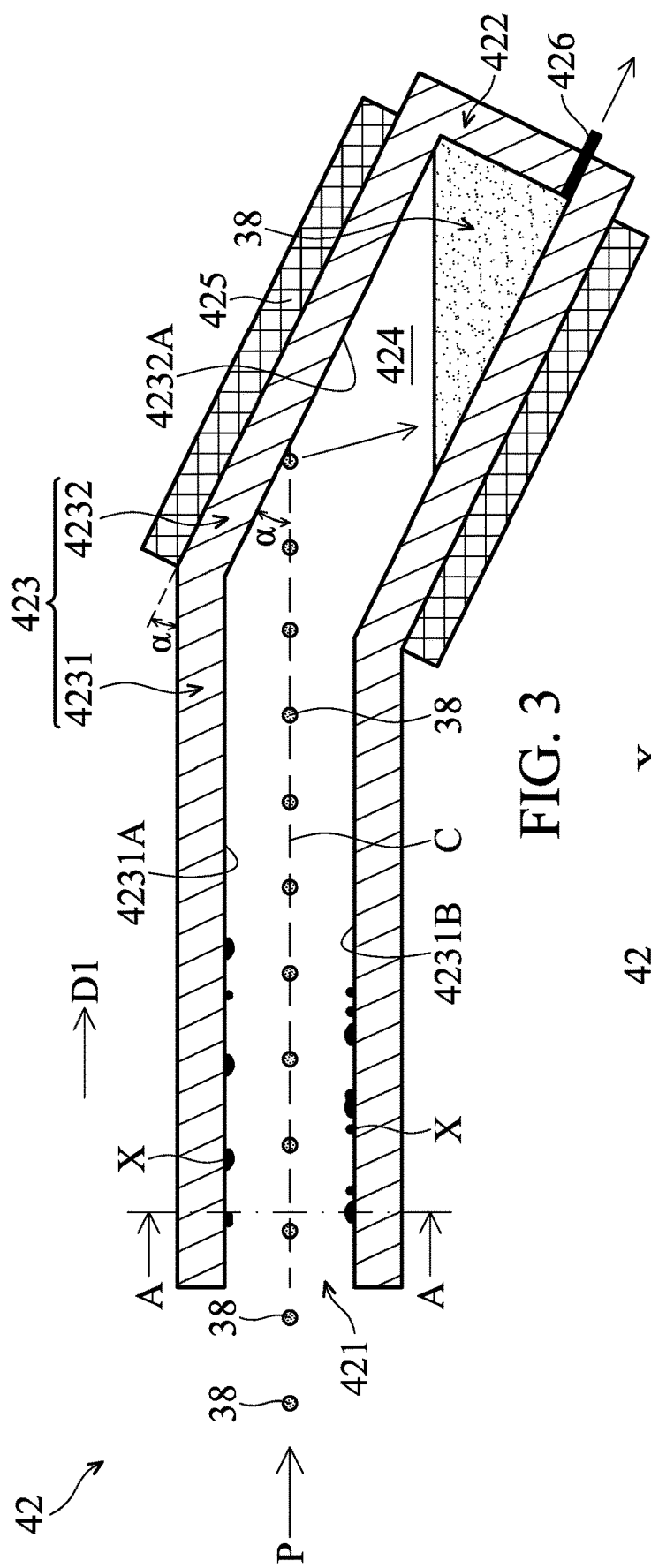
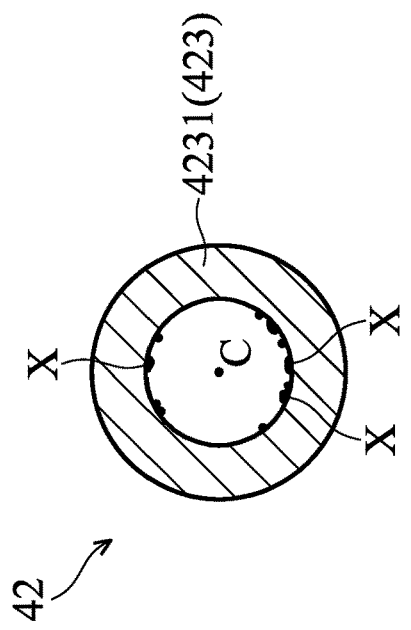
FIG. 3
FIG. 4

EXTREME ULTRAVIOLET RADIATION SOURCE AND DROPLET CATCHER THEREOF

CROSS REFERENCE TO RELATED APPLICATIONS

The present application claims priority of U.S. Provisional Patent Application No. 62/703,953, filed on Jul. 27, 2018, the entirety of which is incorporated by reference herein.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering associated costs.

Such scaling down has also increased the complexity of IC processing and manufacturing. For these advances to be realized, similar developments in IC processing and manufacturing are needed. For example, the need to perform higher resolution lithography processes grows. One lithography technique is extreme ultraviolet lithography (EUVL). The EUVL employs scanners using light in the extreme ultraviolet (EUV) region, having a wavelength of about 1-100 nm. EUV scanners use reflective rather than refractive optics, i.e., mirrors instead of lenses. One type of EUV light source is laser-produced plasma (LPP). LPP technology produces EUV light by focusing a high-power laser beam onto small tin droplets to form highly ionized plasma that emits EUV radiation with a peak of maximum emission at 13.5 nm. The EUV light is then collected by a collector and reflected by optics towards a lithography exposure object, e.g., a wafer.

Although existing devices and methods for generating EUV light have been adequate for their intended purposes, they have not been entirely satisfactory in all respects.

BRIEF DESCRIPTION OF THE DRAWINGS

For a more complete understanding of the present disclosure, and the advantages of the present disclosure, reference is now made to the following descriptions taken in conjunction with the accompanying drawings, in which:

FIG. 3 is a schematic cross-sectional view of the droplet catcher in the EUV radiation source of FIG. 2, in accordance with some embodiments.

FIG. 4 is a cross-sectional view taken along the line A-A in FIG. 3, which illustrates the unused target droplets accumulated on the inner surface of the pipe wall of the droplet catcher.

DETAILED DESCRIPTION

Figure 1:
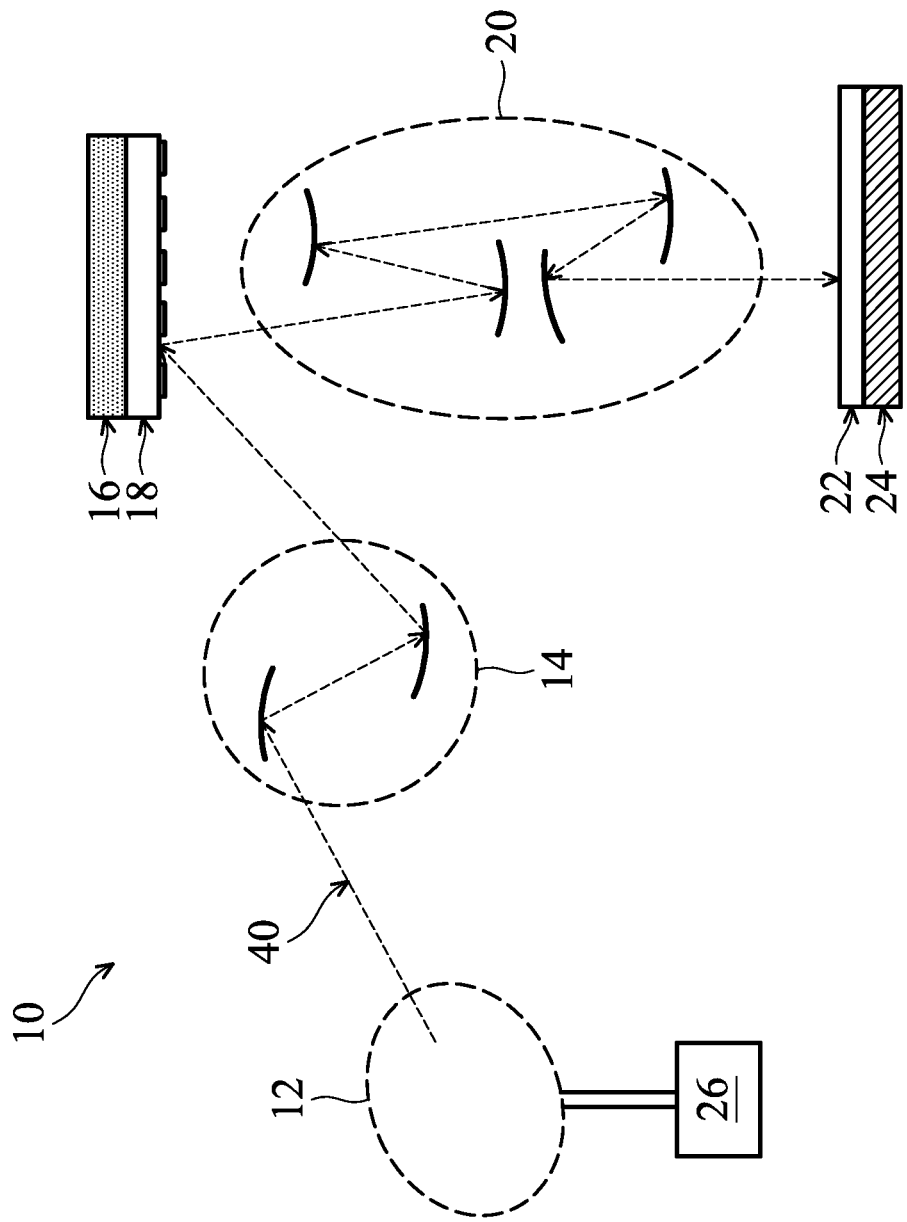
FIG. 1 is a schematic view of an extreme ultraviolet (EUV) lithography system with a laser produced plasma (LPP) EUV radiation source, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Various features may be arbitrarily drawn in different scales for the sake of simplicity and clarity.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

FIG. 1 is a schematic and diagrammatic view of a lithography system 10, in accordance with some embodiments. The lithography system 10 may also be generically referred to as a scanner that is operable to perform lithography exposing processes with respective radiation source and exposure mode.

In the present embodiment, the lithography system 10 is an extreme ultraviolet (EUV) lithography system designed to expose a resist layer by EUV light. The resist layer includes a suitable material sensitive to the EUV light. The EUV lithography system 10 employs a radiation source 12 to generate EUV light, such as EUV light having a wavelength ranging between about 1 nm and about 100 nm. In one particular example, the radiation source 12 generates EUV light with a wavelength centered at about 13.5 nm. Accordingly, the radiation source 12 is also referred to as an EUV radiation source 12. In the present embodiment, the EUV radiation source 12 utilizes a mechanism of laser-produced plasma (LPP) to generate the EUV radiation, which will be further described later.

The lithography system 10 also employs an illuminator 14. In various embodiments, the illuminator 14 includes various refractive optic components, such as a single lens or a lens system having multiple lenses (zone plates) or alternatively reflective optics (for EUV lithography system), such as a single mirror or a mirror system having multiple mirrors in order to direct light from the radiation source 12 onto a mask stage 16 of the lithography system 10, particularly to a mask 18 secured on the mask stage 16. In the present embodiment where the radiation source 12 generates light in the EUV wavelength range, reflective optics is employed.

The mask stage 16 is configured to secure the mask 18. In some embodiments, the mask stage 16 includes an electrostatic chuck (e-chuck) to secure the mask 18. This is because that gas molecules absorb EUV light and the lithography system for the EUV lithography patterning is maintained in a vacuum environment to avoid the EUV intensity loss. In the present disclosure, the terms of mask, photomask, and reticle are used interchangeably.

In the present embodiment, the mask 18 is a reflective mask. One exemplary structure of the mask 18 includes a substrate with a suitable material, such as a low thermal expansion material (LTEM) or fused quartz. In various examples, the LTEM includes $TiO_2$ doped $SiO_2$, or other suitable materials with low thermal expansion. The mask 18 includes a reflective multiple layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The mask 18 may further include a capping layer, such as ruthenium (Ru), disposed on the ML for protection. The mask 18 further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

The lithography system 10 also includes a projection optics module (or projection optics box (POB)) 20 for imaging the pattern of the mask 18 onto a semiconductor substrate 22 secured on a substrate stage 24 of the lithography system 10. In the present embodiment, the POB 20 has reflective optics for projecting the EUV light. The EUV light directed from the mask 18, which carries the image of the pattern defined on the mask 18, is collected by the POB 20. The illuminator 14 and the POB 20 are collectively referred to an optical module of the lithography system 10.

In the present embodiment, the semiconductor substrate 22 is a semiconductor wafer made of silicon or other semiconductor materials. Alternatively or additionally, the semiconductor substrate 22 may include other elementary semiconductor materials such as germanium (Ge). In some embodiments, the semiconductor substrate 22 is made of a compound semiconductor such as silicon carbide (SiC), gallium arsenic (GaAs), indium arsenide (InAs), or indium phosphide (InP). In some embodiments, the semiconductor substrate 22 is made of an alloy semiconductor such as silicon germanium (SiGe), silicon germanium carbide (SiGeC), gallium arsenic phosphide (GaAsP), or gallium indium phosphide (GaInP). In some other embodiments, the semiconductor substrate 22 may be a silicon-on-insulator (SOI) or a germanium-on-insulator (GOI) substrate.

In addition, the semiconductor substrate 22 may have various device elements. Examples of device elements that are formed in the semiconductor substrate 22 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

In the present embodiment, the semiconductor substrate 22 is coated with a resist layer sensitive to the EUV light. Various components including those described above are integrated together and are operable to perform lithography exposing processes.

The lithography system 10 may further include other modules or be integrated with (or be coupled with) other modules. In the present embodiment, the lithography system 10 includes a gas supply module 26 designed to provide hydrogen gas to the radiation source 12. The hydrogen gas helps reduce contamination in the radiation source 12 (e.g., a collector which will be further described later).

Figure 2:
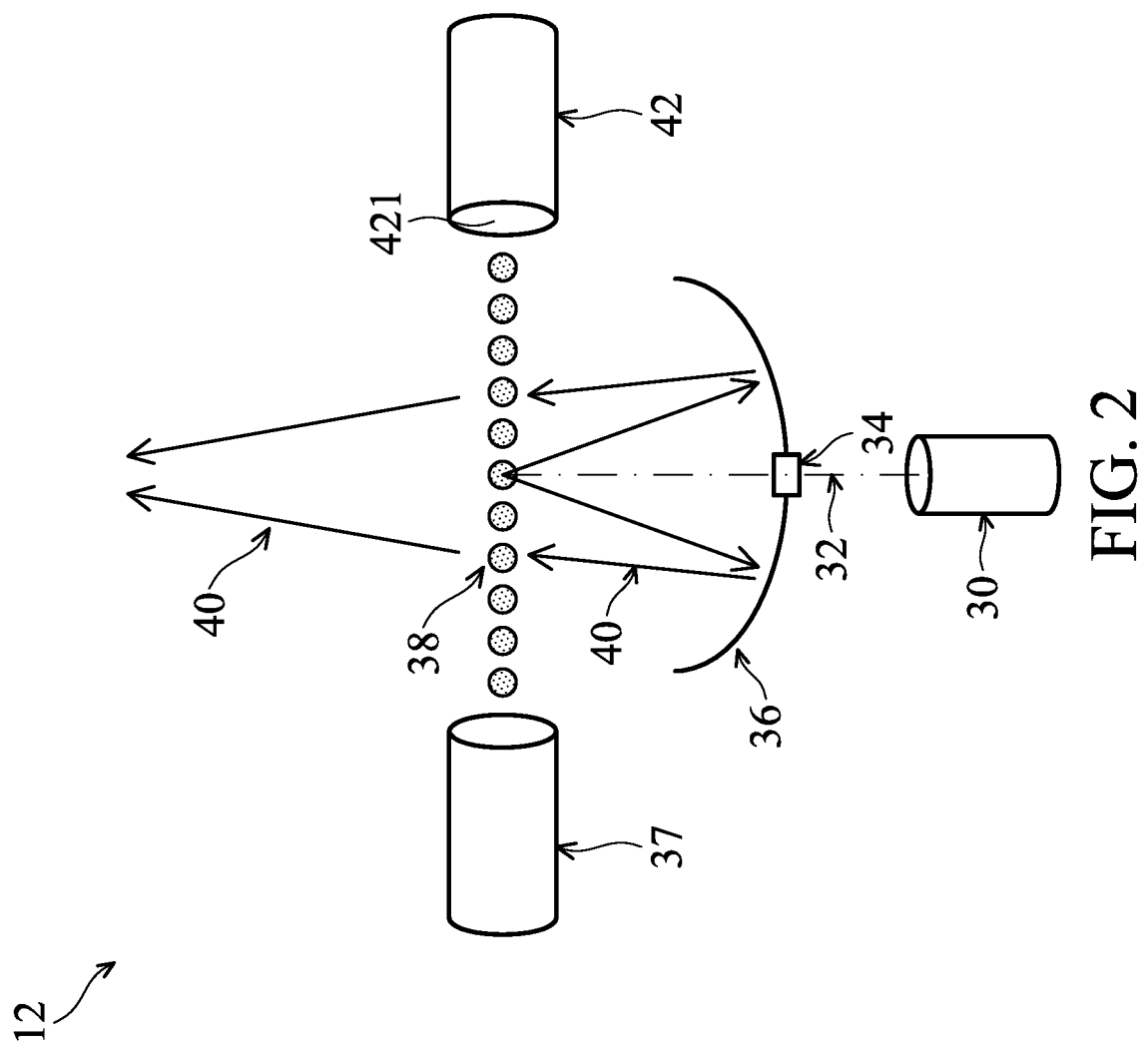
FIG. 2 is a schematic view of the EUV radiation source in the EUV lithography system of FIG. 1, in accordance with some embodiments.

FIG. 2 is a schematic view illustrating partial components of the radiation source 12 in the EUV lithography system 10 of FIG. 1, in accordance with some embodiments. The radiation source 12 employs a laser produced plasma (LPP) mechanism to generate plasma and further generate EUV light from the plasma. Referring to FIG. 2, the radiation source 12 includes a laser source 30, a droplet generator 37, and a collector (also referred to as LPP collector or EUV collector) 36.

The droplet generator 37 generates and outputs a plurality of target droplets 38. In some embodiments, the target droplets 38 are tin (Sn) droplets. In some examples, the tin droplets 38 each may have a diameter about 30 microns (μm) and are generated at a rate about 50 kilohertz (kHz). The tin droplets 38 are introduced into a zone of excitation in the radiation source 12 at a speed about 70 meters per second (m/s) in some examples. Other material may also be used for the target droplets 38, for example, a tin-containing liquid material such as eutectic alloy containing tin, lithium (Li), and xenon (Xe).

The laser source 30 may include a carbon dioxide ($CO_2$) laser source, a neodymium-doped yttrium aluminum garnet (Nd:YAG) laser source, or other suitable laser source to generate a laser beam 32. Although not shown (for the sake of simplicity), the laser beam 32 may be directed by a beam delivery system, such as one or more mirrors, to a focus lens to focus the laser beam 32. The laser beam 32 is further directed through an output window 34 integrated with the collector 36. The output window 34 adopts a suitable material substantially transparent to the laser beam 32. The laser beam 32 is directed to heat the target droplets 38, such as tin droplets, thereby generating high-temperature plasma, which further produces EUV light 40.

The pulses of the laser source 30 and the droplet generating rate of the droplet generator 37 are controlled to be synchronized such that the target droplets 38 receive peak powers consistently from the laser pulses of the laser source 30. In some embodiments, the radiation source 12 may employ a dual LPP mechanism where the laser source 30 is a cluster of multiple laser sources. For example, the laser source 30 may include a pre-heat laser source and a main laser source, which produce pre-heat laser beam and main laser beam, respectively. Each of the pre-heat laser source and the main laser source may be a $CO_2$ laser source, an Nd:YAG laser source, or other suitable laser source. The pre-heat laser beam has a smaller spot size and less intensity than the main laser beam, and is used for pre-heating the target droplet 38 to create a low-density target plume, which is subsequently reheated by the main laser beam, generating increased emission of EUV light 40. The EUV light 40 is collected by the collector 36. The collector 36 further reflects and focuses the EUV light 40 for the lithography exposure processes.

The collector 36 is designed with proper coating materials and shape, functioning as a mirror for EUV collection, reflection and focus. In some examples, the collector 36 is designed to have an ellipsoidal geometry. In some examples, the coating material of the collector 36 is similar to the reflective multilayer of the EUV mask 18. In some examples, the coating material of the collector 36 includes a ML (such as a plurality of Mo/Si film pairs) and may further include a capping layer (such as Ru) coated on the ML to substantially reflect the EUV light. In some embodiments, the collector 36 may further include a grating structure designed to effectively scatter the EUV light directed onto the collector 36. For example, a silicon nitride layer is coated on the collector 36 and is patterned to have a grating pattern.

The radiation source 12 may include other components. For example, it may include a central obscuration (not shown) designed and configured to obscure the laser beam 32, and it may include an intermediate focus (IF)-cap module (not shown) configured to provide intermediate focus to the EUV radiation 40. The radiation source 12 is configured in an enclosed space (referred to as a radiation source vessel; not shown). The radiation source vessel is maintained in a vacuum environment since the air absorbs the EUV light.

In some embodiments, the laser beam 32 may or may not hit every target droplet 38. For example, some target droplets 38 may be purposely missed by the laser beam 32. In the present embodiment, the radiation source 12 also includes a droplet catcher 42, which is installed opposite the droplet generator 37 and in the direction of the movement of the target droplets 38. The droplet catcher 42 is configured to catch any target droplets that are missed by the laser beam 32 (also referred as the unused target droplets).

Referring to FIG. 3, which is a schematic cross-sectional view illustrating portions of the droplet catcher 42 in the EUV radiation source 12 of FIG. 2, in accordance with some embodiments. In the present embodiment, the droplet catcher 42 is an elongated tube having a circular cross section. However, the droplet catcher 42 can also be an elongated tube having a cross section that can be oblong, oval, rectangular, square, or any other suitable shape in some other embodiments. As shown in FIG. 3, the droplet catcher 42 includes an open end 421 oriented toward the droplet generator 37 (see FIG. 2). The circular open end 421 can be substantially centered on (i.e., aligned with) a linear target droplet path P along which the target droplets 38 from droplet generator 37 are typically moved. The linear target droplet path P can be parallel to a horizontal direction D1. The droplet catcher 42 also includes an enclosed end 422 opposite to the open end 421.

In addition, the droplet catcher 42 includes a pipe wall 423 disposed between the open end 421 and the enclosed end 422. As shown in FIG. 3, the pipe wall 423 includes a first pipe wall portion 4231 and a second pipe wall portion 4232 that are connected together. The long axes of the first pipe wall portion 4231 and second pipe wall portion 4232 are substantially extending along the horizontal direction D1.

As shown in FIG. 3, the first pipe wall portion 4231 is disposed adjacent to the open end 421, and has a centerline C (depicted in dashed line) that can be aligned with the target droplet path P. The inner top surface 4231A and the inner bottom surface 4231B of the first pipe wall portion 4231 are substantially parallel to the centerline C (and the target droplet path P and the horizontal direction D1). The second pipe wall portion 4232 is disposed adjacent to the enclosed end 422 (i.e., between the first pipe wall portion 4231 and the enclosed end 422). The second pipe wall portion 4232 can be angled slightly downwards relative to the first pipe wall portion 4231 (and the target droplet path P and the horizontal direction D1). For example, the second pipe wall portion 4232 is at a selected angle α (see FIG. 3) to the first pipe wall portion 4231 (and the target droplet path P and the horizontal direction D1), for example between about 1 degree and about 45 degrees based on actual requirements.

Accordingly, the unused target droplets 38 impacts the inner top surface 4232A of the second pipe wall portion 4232 after passing through the first pipe wall portion 4231, and then enters into a low-lying region (also referred as a reservoir 424) formed between the second pipe wall portion 4232 and the enclosed end 422. The reservoir 424 can contain a quantity of unused target droplets 38 in liquid form, as shown in FIG. 3. A heating element 425 is thermally coupled to the second pipe wall portion 4232 to heat the second pipe wall portion 4232 above the melting point of the collected unused target droplets 38, for example a temperature between about 232 degrees and about 400 degrees (for a tin target material). For example, the droplet catcher 42 may further include a double wall (not shown) so that at least one space is formed between the pipe wall 423 and the double wall. The heating element 425 can be implemented by circulating a fluid, gas or liquid having the desired temperature through the space to control the temperature of the reservoir 424, in some embodiments. The droplet catcher 42 can be manufactured from titanium or other suitable materials compatible with liquid target material and high temperature environment.

Once accumulated in significant amount, the liquid target droplets 38 retrieved in the reservoir 424 can be drained through a heated tube 426. The tube 426 can act as a freeze valve as the liquid target droplets 38 in the tube 426 can freeze or solidify when the target droplets 38 in the tube 426 is below the melting point, thereby closing the tube 426. When the tube 426 is heated, the solid target droplets 38 in the tube melts and the tube 426 open, allowing the liquid target droplets 38 to flow out of the reservoir 424. Accordingly, recycling of the unused target droplets 38 is achieved.

It is found that some target droplets 38 from the droplet generator 37 may not always move along the preset target droplet path P due to gas flow in the radiation source vessel, targeted offset of the droplet generator 37 and many uncertainties, and they may hit the pipe wall 423 of the droplet catcher 42 and not successfully reach the reservoir 424 for recycling.

For example, the unused target droplets 38 hit the inner surface of the first pipe wall portion 4231 will cool to become micro particles or puddles X accumulated on the inner surface, as shown in FIG. 3 (see also FIG. 4). When the radiation source vessel heats up (e.g., during the generation of EUV light), the accumulated puddles X near the open end 421 melt and may escape back into the radiation source vessel (this is also called backsplash of the unused target droplets) to deposit on the reflective surface of the collector 36, thereby causing contamination thereon. Over time, the reflectivity of the collector 36 degrades due to debris accumulation. Once the reflectively is degraded to a certain degree, the collector 36 reaches the end of its usable lifetime and may need to be swapped out.

The following embodiments provide mechanisms for reducing the backsplash of the unused target droplets from the droplet catcher to reduce contamination of the reflective surface of the collector, thereby extending its usable lifetime.

Figure 5A:
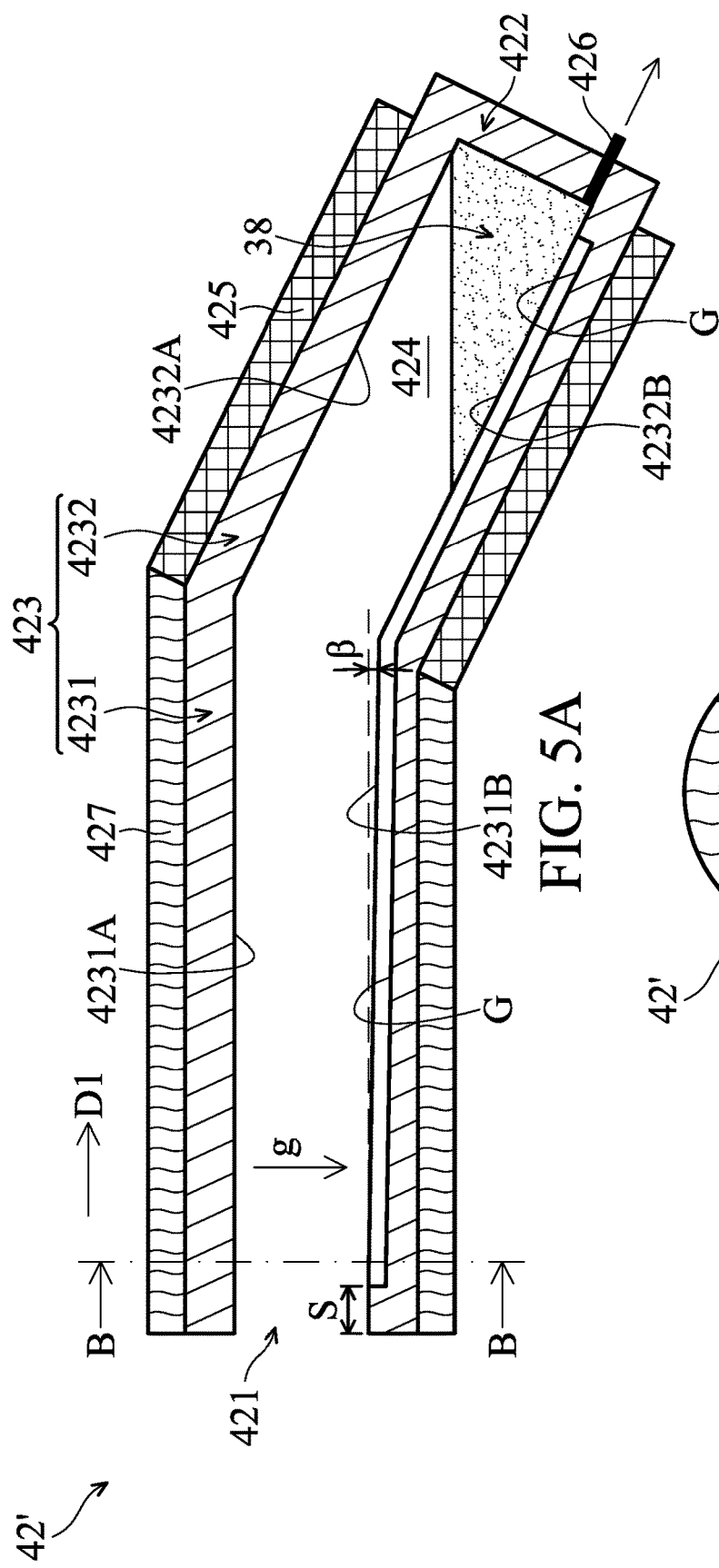
FIG. 5A is a schematic cross-sectional view of a droplet catcher, in accordance with some embodiments.
Figure 5B:
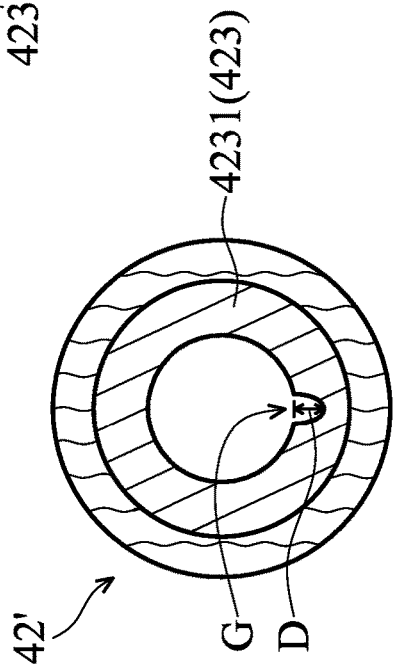
FIG. 5B is a cross-sectional view taken along the line B-B in FIG. 5A.

FIG. 5A is a schematic cross-sectional view of a droplet catcher 42', in accordance with some other embodiments, and FIG. 5B is a cross-sectional view taken along the line B-B in FIG. 5A. The droplet catcher 42' differs from the droplet catcher 42 of FIGS. 3 and 4 in that the inner top surface 4231A of the first pipe wall portion 4231 is substantially parallel to the horizontal direction D1 (i.e., parallel to the target droplet path P (FIG. 3)), and the inner bottom surface 4231B of the first pipe wall portion 4231 is inclined relative to the inner top surface 4231A and the horizontal direction D1. As shown in FIG. 5A, the inner bottom surface 4231B of the first pipe wall portion 4231 may have a decreasing slope toward the enclosed end 422. A selected angle β is formed between the inner bottom surface 4231B of the first pipe wall portion 4231 and the horizontal direction D1, for example between about 1 degree and about 30 degrees based on actual requirements.

The droplet catcher 42' further includes an elongated gutter G formed on the inner bottom surface of the pipe wall 423. As shown in FIG. 5A, the gutter G is formed on the inner bottom surface 4231B of the first pipe wall portion 4231 and has a long axis extending along the horizontal direction D1. One end of the gutter G is a distance S away from the open end 421 so that the open end 421 of the droplet catcher 42' remains round when viewed from the open end 421. Referring to FIG. 5B together, the gutter G may have a U-shaped cross section or a semicircular cross section. In some embodiments, the gutter G has a depth D of at least 0.1 mm, which is lower than the inner bottom surface 4231B of the first pipe wall portion 4231. For example, the gutter G may have a depth of up to 10 mm.

Figure 6:
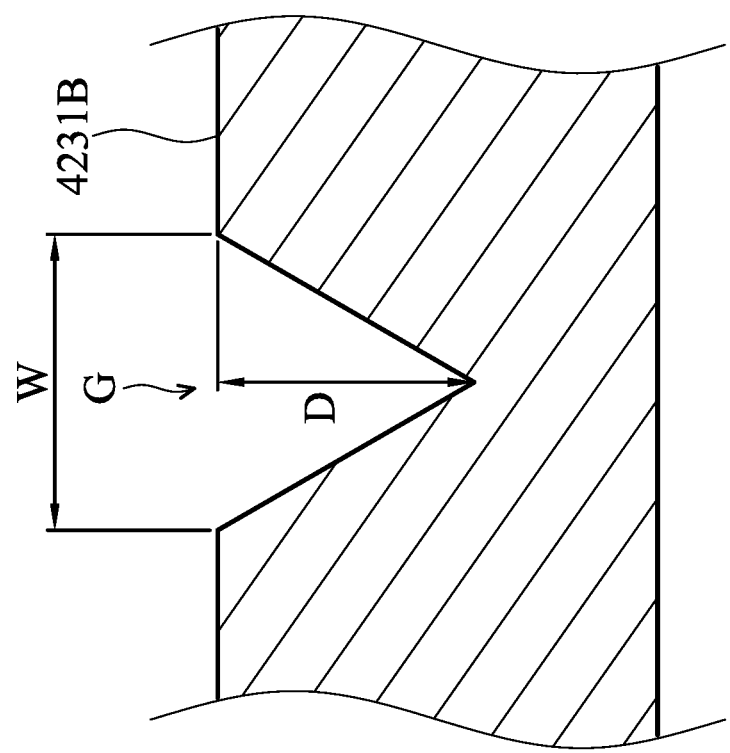
FIG. 6 is a cross-sectional view showing the gutter with a V-shaped cross section, in accordance with some embodiments.

Referring to FIG. 6, which is a cross-sectional view showing the gutter G with a V-shaped cross section, in accordance with some other embodiments. If the gutter G has a V-shaped cross section, then the width W of the groove G will be determined by its depth D. The width W is typical proportional to the depth D. In some embodiments, the V-shaped groove G may have a width W of at least 0.1 mm. For example, the V-shaped gutter G may have a width of up to 5 mm and a depth of up to 10 mm. It should be appreciated that the groove G may have any other suitable sectional shape which provides capillary action, thereby promoting the flow of melted micro particles or puddles X (FIG. 3) into the groove G, which will be further described later.

Referring back to FIG. 5A, the gutter G may extend further through the inner bottom surface 4232B of the second pipe wall portion 4232, along the horizontal direction D1, toward the enclosed end 422. The gutter G formed on the inner bottom surface 4232B of the second pipe wall portion 4232 has a sectional shape and size similar to those of the gutter G formed on the inner bottom surface 4231B of the first pipe wall portion 4231 described above. However, the elongated gutter G can be formed on the inner bottom surface 4231B of the first pipe wall portion 4231 but not on the inner bottom surface 4232B of the second pipe wall portion 4232, in some other embodiments.

In the embodiments illustrated in FIGS. 5A and 5B, the droplet catcher 42' may further include a heating element 427 thermally coupled to the first pipe wall portion 4231 to heat the first pipe wall portion 4231 above the melting point of the accumulated puddles X or the unused target droplets 38 (FIG. 3), for example a temperature between about 232 degrees and about 400 degrees (for a tin target material). In some embodiments, the heating element 427 can be implemented in a manner similar to the heating element 425 described above. Alternatively, the heating element 427 may be an active heating element including a resistive coating attached to the outer peripheral surface of the first pipe wall portion 4231, and a temperature control component that can apply a suitable electrical signal to the resistive coating, thereby heating the first pipe wall portion 4231. In some embodiments, the heating element 427 and the heating element 425 independently control the temperature of the first pipe wall portion 4231 and the second pipe wall portion 4232, respectively.

Figure 7:
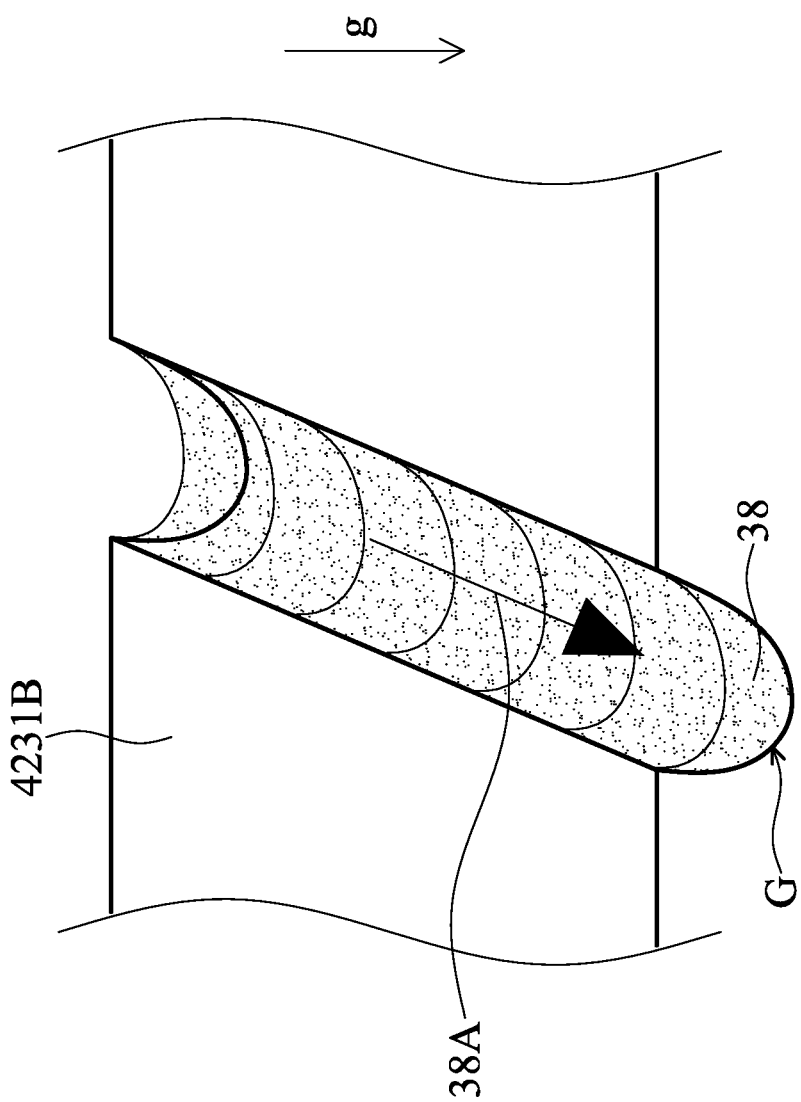
FIG. 7 is a schematic view illustrating that the sloped gutter directs the flow of the collected unused target droplets under the influence of gravity.

With the above design, the heating element 427 can be operated properly to heat the first pipe wall portion 4231 so that the micro particles or puddles X accumulated on the inner surface of the first pipe wall portion 4231 will be melted to return to the liquid or droplet state (i.e. the target droplets 38) quickly, or even no micro particles or puddles X will accumulate on the inner surface of the first pipe wall portion 4231. The target droplets 38 can be concentrated on the inner lower surface 4231B of the first pipe wall portion 4231 due to gravity g. As shown in FIG. 7, the gutter G (having a V-shaped or any other suitable shape cross section) formed on the inner lower surface 4231B provides capillary action to cause the target droplets 38 to spread out along the gutter G. In addition, the gutter G may draw the target droplets 38 into the gutter G from the surrounding area. Furthermore, the sloped gutter G directs the flow 38A of the collected unused target droplets 38 under the influence of gravity g toward the reservoir 424 near the enclosed end 422 of the droplet catcher 42' (FIG. 5A).

As a result, there is less backsplash of the unused target droplets from the droplet catcher, thereby reducing contamination of the reflective surface of the collector and extending its usable lifetime. Moreover, it is possible to increase the recycling rate of unused target droplets.

Figure 8:
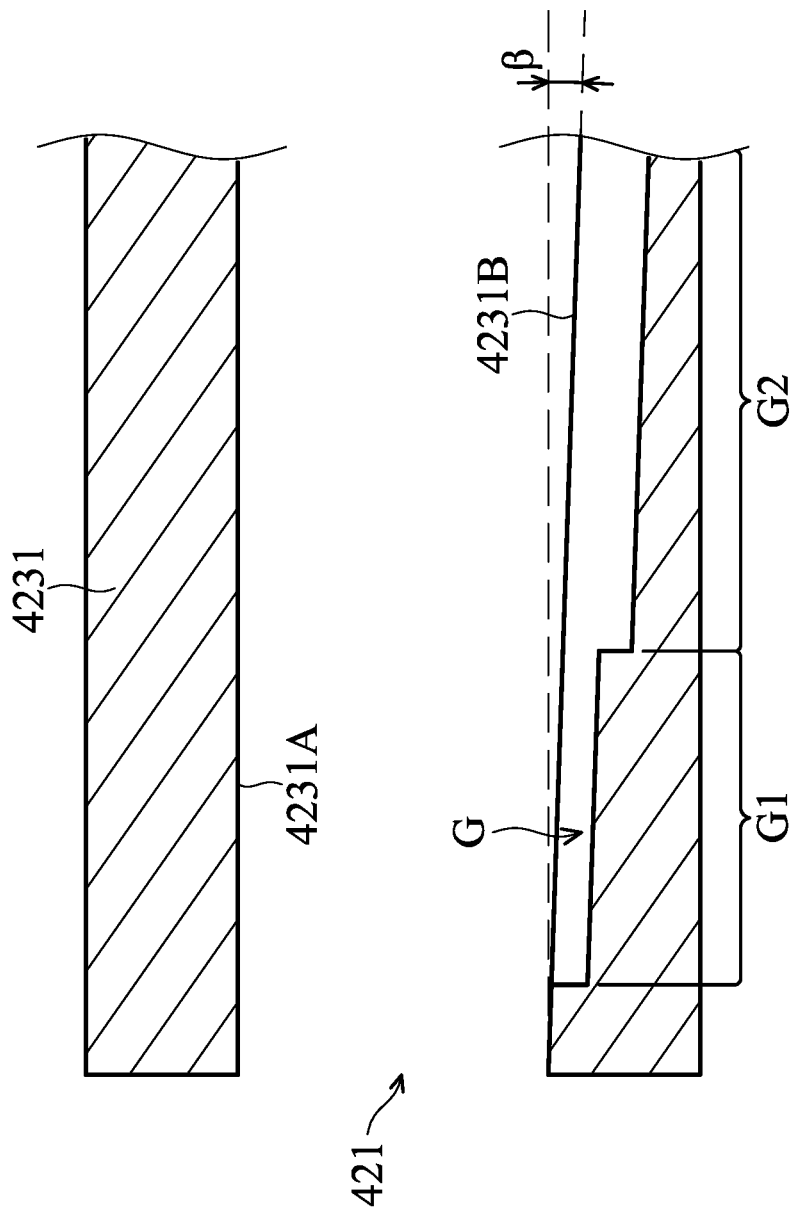
FIG. 8 is a schematic view illustrating the bottom of the gutter including at least one step, in accordance with some embodiments.

It should be appreciated that many variations and modifications can be made to embodiments of the disclosure. For example, the bottom of the gutter G includes at least one step in some embodiments. As shown in FIG. 8, in some embodiments, the gutter G formed on the inner bottom surface 4231B of the first pipe wall portion 4231 includes a first portion G1 adjacent to the open end 421 and a second portion G2 adjacent to the second pipe wall potion 4232 (see FIG. 5A). The bottom of the first portion G1 and the bottom of the second portion G2 are parallel to the sloped inner bottom surface 4231B. The depth of the second portion G2 is greater than the depth of the first portion G1 so that the bottom of the gutter G forms a step. Although not shown, the second portion G2 can have a greater width than the first portion G1 to allow the target droplets 38 to more easily fill the second portion G2. The depth and the width of the first portion G1 and second portion G2 of the gutter G can be selected properly as described above to direct the flow of the collected unused target droplets smoothly. In some other embodiments, the bottom of the gutter G may include more than two steps.

Figure 9:
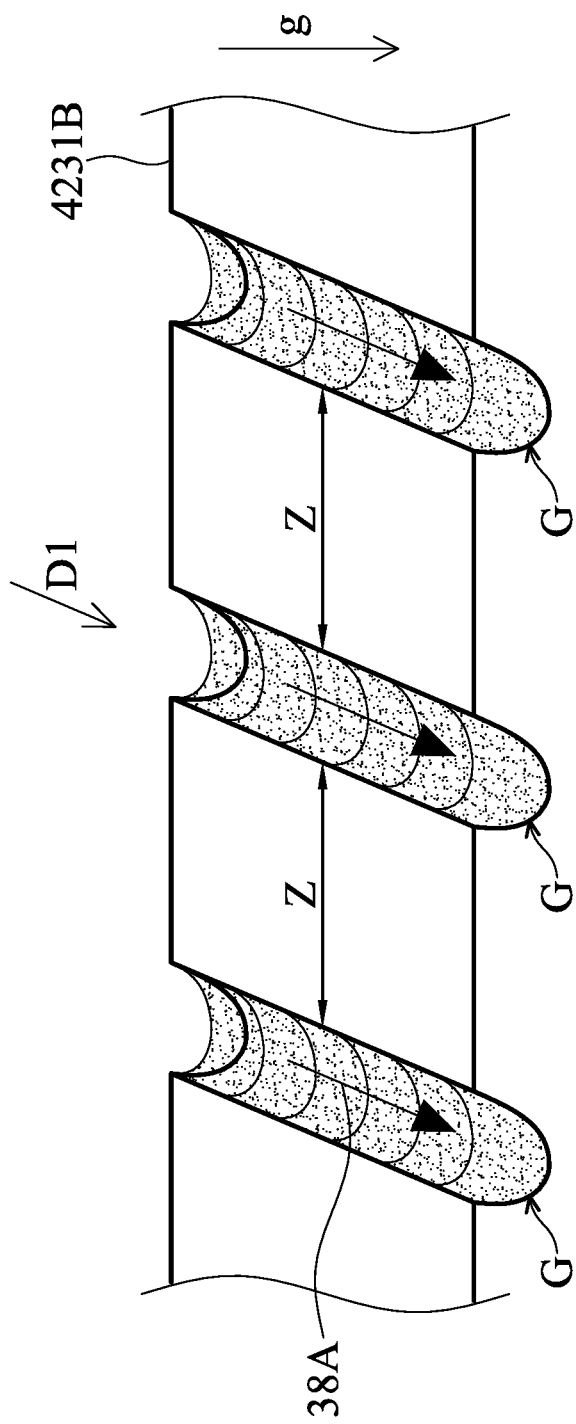
FIG. 9 is a schematic view illustrating the inner bottom surface of the pipe wall provided with a plurality of gutters, in accordance with some embodiments.

In some other embodiments, the number of gutters G can also be greater than one. For example, a plurality of parallel gutters G (extending along the horizontal direction D1) can be formed on the inner bottom surface 4231B of the first pipe wall portion 4231 to direct the flows 38A of the unused target droplets, in some embodiments as shown in FIG. 9 (note that the inner bottom surface 4231B is depicted as a plane for simplicity, but it is actually a curved surface). The spacing Z between adjacent gutters G may for example be 6 mm or less. Although not shown, the gutters G may extend further through the inner bottom surface 4232B of the second pipe wall portion 4232, along the horizontal direction D1, toward the enclosed end 422.

Figure 10:
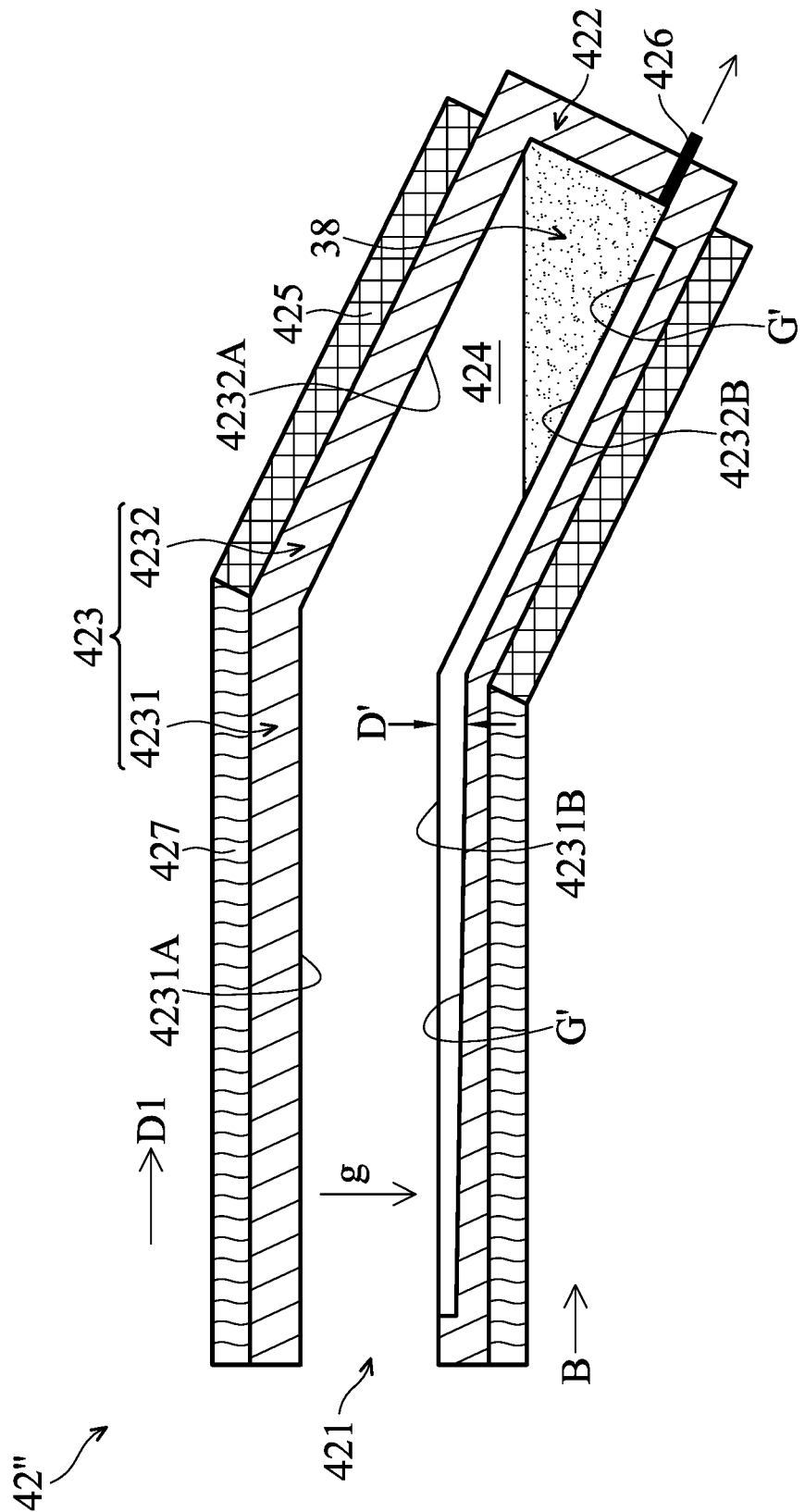
FIG. 10 is a schematic cross-sectional view of a droplet catcher, in accordance with some embodiments.

FIG. 10 is a schematic cross-sectional view of a droplet catcher 42", in accordance with some other embodiments. The droplet catcher 42" differs from the droplet catcher 42' of FIGS. 5A and 5B in that the inner top surface 4231A and the inner bottom surface 4231B of the first pipe wall portion 4231 can be substantially parallel to the horizontal direction D1 (i.e., parallel to the target droplet path P (FIG. 3)), and an elongated gutter G' is formed on the inner bottom surface of the pipe wall 423.

As shown in FIG. 10, the gutter G' is formed on the inner bottom surface 4231B of the first pipe wall portion 4231 and has a long axis extending along the horizontal direction D1. Moreover, the distance D' between the inner bottom surface 4231B and the bottom of the gutter G' (i.e., the depth of the gutter G') gradually increases toward the second pipe wall portion 4232 and the enclosed end 422, for example from about 0.2 mm to about 2 mm, to form a sloped gutter G'. Although not shown, the gutter G' may have a U-shaped, a semicircular, a V-shaped or any other suitable shape cross-section. In various examples, the width of the gutter G' can remain the same or gradually increase toward the second pipe wall portion 4232 and the enclosed end 422. The sloped gutter G' also directs the flow of the collected unused target droplets under the influence of gravity g toward the reservoir 424.

In the present embodiment, the gutter G' extends further through the inner bottom surface 4232B of the second pipe wall portion 4232, along the horizontal direction D1, toward the enclosed end 422. The depth of the gutter G' formed on the bottom surface 4232B of the second pipe wall portion 4232 is substantially the same toward the enclosed end 422. In some other embodiments, the elongated gutter G' can be formed on the inner bottom surface 4231B of the first pipe wall portion 4231 but not on the inner bottom surface 4232B of the second pipe wall portion 4232.

The embodiments of the present disclosure have some advantageous features: the heating element thermally coupled to the first pipe wall portion is operable to heat the first pipe wall portion so that the micro particles or puddles accumulated on its inner surface will be melted to return to the liquid or droplet state quickly, or even no micro particles or puddles will accumulate on the inner surface of the first pipe wall portion. The unused target droplets can be concentrated on the inner lower surface of the first pipe wall portion due to gravity. Afterwards, the sloped gutter provided on the inner bottom surface of the first pipe wall portion directs the flow of the collected unused target droplets under the influence of gravity toward the reservoir of the droplet catcher. As a result, there is less backsplash of the unused target droplets from the droplet catcher, thereby reducing contamination of the reflective surface of the collector and extending its usable lifetime. Moreover, it is possible to increase the recycling rate of unused target droplets.

In some embodiments, an extreme ultraviolet radiation source is provided. The extreme ultraviolet radiation source includes a droplet generator and a droplet catcher. The droplet generator is configured to output a plurality of target droplets along a target droplet path that is parallel to a horizontal direction. The droplet catcher includes an open end substantially aligned with the target droplet path, and an enclosed end that is opposite to the open end. The droplet catcher also includes a pipe wall disposed between the open end and the enclosed end. The pipe wall includes a first pipe wall portion having an inner top surface parallel to the horizontal direction and an inner bottom surface inclined relative to the inner top surface. In addition, the droplet catcher includes at least one gutter formed on the inner bottom surface and having a long axis extending along the horizontal direction.

In some embodiments, a droplet catcher for an extreme ultraviolet radiation source is provided. The droplet catcher includes an open end allowing a plurality of target droplets to enter the droplet catcher, and an enclosed end that is opposite to the open end. The droplet catcher also includes a pipe wall disposed between the open end and the enclosed end. The inner pipe wall includes a first pipe wall portion having an inner top surface parallel to a horizontal direction and an inner bottom surface inclined relative to the inner top surface. In addition, the droplet catcher includes at least one gutter formed on the inner bottom surface and having a long axis extending along the horizontal direction.

In some embodiments, a droplet catcher for an extreme ultraviolet radiation source is provided. The droplet catcher includes an open end allowing a plurality of target droplets to enter the droplet catcher, and an enclosed end that is opposite to the open end. The droplet catcher also includes a pipe wall disposed between the open end the enclosed end. The pipe wall includes a first pipe wall portion having an inner top surface and an inner bottom surface parallel to a horizontal direction. The droplet catcher further includes at least one gutter formed on the bottom surface and having a long axis extending along the horizontal direction. The distance between the bottom surface and the bottom of the gutter gradually increases toward the enclosed end. In addition, the droplet catcher includes a heating element thermally coupled to the first pipe wall portion.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An extreme ultraviolet radiation source, comprising:
    a droplet generator configured to output a plurality of target droplets along a target droplet path that is parallel to a horizontal direction; and
    a droplet catcher, comprising:
        an open end substantially aligned with the target droplet path;
        an enclosed end being opposite to the open end;
        a pipe wall disposed between the open end and the enclosed end, wherein the pipe wall includes a first pipe wall portion having an inner top surface parallel to the horizontal direction and an inner bottom surface inclined relative to the inner top surface; and
        at least one gutter formed on the inner bottom surface and having a long axis extending along the horizontal direction.

2. The extreme ultraviolet radiation source as claimed in claim 1, wherein the inner bottom surface of the first pipe wall portion has a decreasing slope toward the enclosed end.

3. The extreme ultraviolet radiation source as claimed in claim 1, wherein an angle is formed between the inner bottom surface of the first pipe wall portion and the horizontal direction, the angle being between about 1 degree and about 30 degrees.

4. The extreme ultraviolet radiation source as claimed in claim 1, further comprising a heating element thermally coupled to the first pipe wall portion.

5. The extreme ultraviolet radiation source as claimed in claim 1, wherein the first pipe wall portion is adjacent to the open end.

6. The extreme ultraviolet radiation source as claimed in claim 5, wherein the pipe wall further includes a second pipe wall portion disposed between the first pipe wall portion and the enclosed end, and the second pipe wall portion is at an angle to the horizontal direction, the angle being between about 1 degree and about 45 degrees.

7. The extreme ultraviolet radiation source as claimed in claim 6, wherein the gutter is extending through a second inner bottom surface of the second pipe wall portion, along the horizontal direction, toward the enclosed end.

8. The extreme ultraviolet radiation source as claimed in claim 7, further comprising a heating element thermally coupled to the second pipe wall portion.

9. The extreme ultraviolet radiation source as claimed in claim 1, wherein the gutter has a U-shaped cross-section.

10. The extreme ultraviolet radiation source as claimed in claim 1, wherein the gutter has a V-shaped cross-section.

11. The extreme ultraviolet radiation source as claimed in claim 1, wherein a bottom of the gutter includes at least one step.

12. The extreme ultraviolet radiation source as claimed in claim 1, further comprising a plurality of gutters formed on the inner bottom surface of the first pipe wall portion and parallel to each other.

13. The extreme ultraviolet radiation source as claimed in claim 1, further comprising:
    a laser source configured to generate a laser beam to heat the target droplets to produce extreme ultraviolet light;
    a collector configured to collect and reflect the extreme ultraviolet light.

14. A droplet catcher for an extreme ultraviolet radiation source, comprising:
    an open end allowing a plurality of target droplets to enter the droplet catcher;
    an enclosed end being opposite to the open end;
    a pipe wall disposed between the open end and the enclosed end, wherein the pipe wall includes a first pipe wall portion having an inner top surface parallel to a horizontal direction and an inner bottom surface inclined relative to the inner top surface; and
    at least one gutter formed on the inner bottom surface and having a long axis extending along the horizontal direction.

15. The droplet catcher as claimed in claim 14, wherein the inner bottom surface of the first pipe wall portion has a decreasing slope toward the enclosed end.

16. The droplet catcher as claimed in claim 15, wherein the gutter has a depth lower than the inner bottom surface of the first pipe wall portion.

17. The droplet catcher as claimed in claim 14, further comprising a heating element thermally coupled to the first pipe wall portion.

18. The droplet catcher as claimed in claim 14, wherein the first pipe wall portion is adjacent to the open end, and an end of the gutter is a distance away from the open end.

19. The droplet catcher as claimed in claim 18, wherein the pipe wall further includes a second pipe wall portion disposed between the first pipe wall portion and the enclosed end, and the second pipe wall portion is at an angle to the first pipe wall portion to form a reservoir for capturing the target droplets.

20. A droplet catcher for an extreme ultraviolet radiation source, comprising:
    an open end allowing a plurality of target droplets to enter the droplet catcher;
    an enclosed end being opposite to the open end;
    a pipe wall disposed between the open end the enclosed end, wherein the pipe wall includes a first pipe wall portion having an inner top surface and an inner bottom surface parallel to a horizontal direction;
    at least one gutter formed on the inner bottom surface and having a long axis extending along the horizontal direction, wherein a distance between the inner bottom surface and a bottom of the gutter gradually increases toward the enclosed end; and
    a heating element thermally coupled to the first pipe wall portion.

* * * * *